United States Patent [19]

Tam

[11] Patent Number: 4,547,446
[45] Date of Patent: Oct. 15, 1985

[54] MOTION MEASUREMENT AND ALIGNMENT METHOD AND APPARATUS

[75] Inventor: Wai-Ming Tam, Danbury, Conn.

[73] Assignee: The Perkin-Elmer Corporation, Norwalk, Conn.

[21] Appl. No.: 505,591

[22] Filed: Jun. 20, 1983

[51] Int. Cl.⁴ .................................................. G03F 9/00
[52] U.S. Cl. ........................................ 430/22; 430/320; 430/323; 430/394; 356/399; 356/401
[58] Field of Search ................. 430/22, 320, 323, 394, 430/396; 356/399, 401

[56]  References Cited

U.S. PATENT DOCUMENTS 3,783,520  1/1974  King .................................. 430/22 X

FOREIGN PATENT DOCUMENTS 58-39015  3/1983  Japan ..................................... 430/22

Primary Examiner—John E. Kittle
Assistant Examiner—José G. Dees
Attorney, Agent, or Firm—Edwin T. Grimes; Thomas P. Murphy; Francis L. Masselle

[57] ABSTRACT

The present invention is directed to motion measurement and alignment method and apparatus for use, interalia, in association with optical lithographic systems and more particularly in one form thereof to a method of making a wafer-tool for testing the mask-wafer stage motion and the mask-wafer stage alignment comprising the steps of: inserting a master mask, having an alignment pattern and a motion measurement pattern thereon, into a projection mask aligner, inserting a photoresist-coated semiconductor wafer into said projection mask aligner, aligning the mask and wafer with respect to each other using the alignment pattern, exposing the photoresist on the wafer, chemically etching the wafer to perfect the motion measurement pattern thereon, thereby forming a wafer-tool having an image of the motion measurement pattern. According to one aspect of the invention there is provided a universal master mask for use in making a wafer-tool for testing the mask-wafer stage motion and the mask-wafer stage alignment in an optical lithographic system which includes a pattern of opaque and transparent areas formed on a transparent substrate wherein one of the areas is characterized by an alignment pattern and a separate motion measurement pattern.

4 Claims, 6 Drawing Figures

MOTION MEASUREMENT AND ALIGNMENT METHOD AND APPARATUS

FIELD OF INVENTION

This invention relates to motion measurement and alignment method and apparatus, and is particularly adapted, among other possible uses, for use in association with optical lithographic systems, which effect the exposure of photoresist-coated semiconductor wafers in the manufacture of integrated circuits.

This application is closely related to the application entitled: "Fine Alignment System", filed on June 20, 1983, Ser. No. 505,592. The disclosure therein is incorporated herein by reference.

BACKGROUND OF THE INVENTION

Heretofore difficulty has been experienced manufacturing accurate tooling for testing the mask-wafer stage motion and the mask-wafer stage alignment in optical lithographic projection systems. Suitable projection systems of this type include, for example, Micralign machines, as manufactured by The Perkin-Elmer Corporation, Norwalk, CT.

In the past, test masks were made in the laboratory by scribing thereon a pair of crosshairs, one on one side and the other on the opposite side. Test wafers were also made in the lab, usually from aluminum, by scribing a pattern thereon. Then a lithographic projection system was tested by using a microscope to view between the mask and the wafer, e.g., the line of the mask cutting across the wafer pattern was observed. This was merely a pass or no pass test. The degree of resolution was not determined.

The present contribution to the art is a new system, which is an improvement over such prior art systems, as will become apparent as the description proceeds.

SUMMARY OF THE INVENTION

In order to accomplish the desired results, the invention provides, in one form thereof, a new and improved method of making a wafer-tool for testing the mask-wafer stage motion and the mask-wafer alignment in an optical lithographic system, which comprises the steps of inserting a master mask, having an alignment pattern and a motion measurement pattern thereon, into a projection mask aligner. The method further comprises the steps of inserting a photoresist-coated semiconductor silicon wafer into said projection mask aligner, aligning the mask and wafer with respect to each other using the alignment pattern, and exposing the photoresist on said wafer. In addition, the method according to the invention includes the steps of chemically etching the wafer to perfect the motion measurement pattern thereon, thereby forming the wafer-tool having images of the motion measurement pattern.

According to one aspect of the invention, the wafer is a conventional circular wafer having a flat portion on the periphery and said alignment pattern on said master mask comprises three spaced portions disposed so that, when the mask and wafer are in alignment with respect to each other, two portions of the patterns are in alignment with the flat portion of the wafer and the third portion of the pattern is in alignment with the periphery of the wafer.

According to another aspect of the invention the wafer is a conventional circular wafer having a V-shaped notch on the periphery thereof, and said alignment pattern on the master mask comprises three spaced patterns disposed so that, when the mask and wafer are in alignment with respect to each other, two portions of the patterns are in alignment with the sides of the V-shaped notch on the wafer and the third portion of the pattern is in alignment with the periphery of the wafer.

According to still another aspect of the invention after completing the first wafer-tool, a second photoresist-coated semiconductor wafer is inserted into the projection mask aligner, the master mask is rotated through a preselected portion of a revolution, and the photoresist on the second wafer is exposed. The method further comprises the step of chemically etching the second wafer to perfect the fine stage motion measurement pattern thereon, thereby forming a second wafer-tool having an image of the fine stage motion measurement pattern.

According to another form of the invention, a universal master mask is provided for use in making a wafer-tool for testing the mask-wafer stage motion and the mask-wafer stage alignment in an optical lithographic system, which has a pattern of opaque and transparent areas formed on a transparent substrate wherein one of the areas is characterized by an alignment pattern and a separated motion measurement pattern.

There has thus been outlined rather broadly the more important features of the invention in order that the detailed description thereof that follows may be better understood, and in order that the present contribution to the art may be better appreciated. There are, of course, additional features of the invention that will be described hereinafter which will form the subject of the claims appended hereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention.

Specific embodiments of the invention have been chosen for purposes of illustration and description, and are shown in the accompanying drawings, forming a part of the specification.

DETAILED DESCRIPTION OF THE INVENTION

Figure 1:
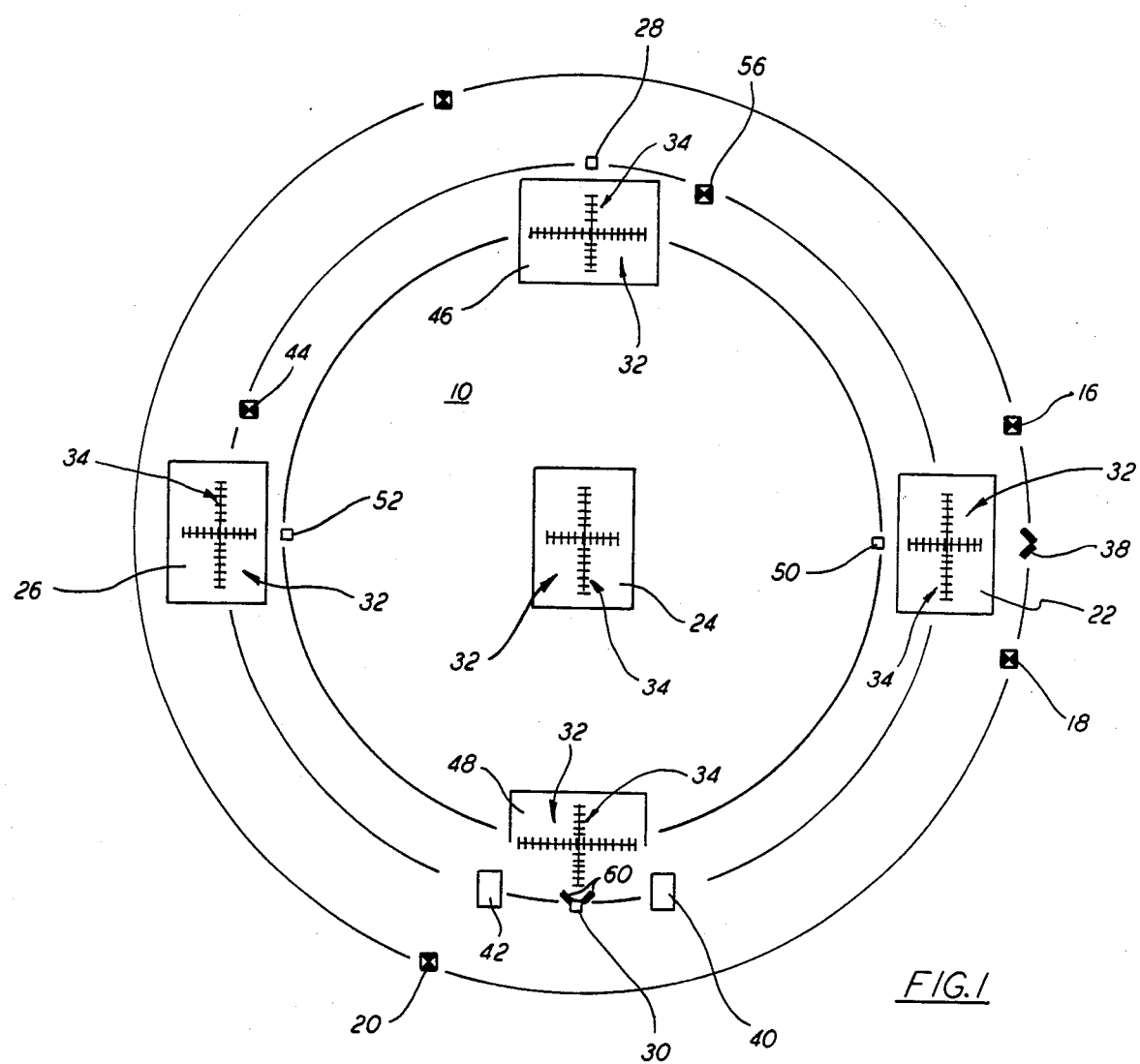
FIG. 1 is an enlarged plan view of the universal master mask having indicia according to the present invention.

Referring to FIG. 1, a universal master mask 10 is illustrated, which is particularly adapted for use in making a wafer-tool for testing the mask-wafer stage motion and the mask-wafer stage alignment and range of alignment motion in an optical lithographic system. This mask comprises a pattern of opaque and transparent areas formed on a transparent substrate wherein one of said areas is characterized by an alignment pattern and a separate motion measurement pattern.

Referring in particular to the alignment pattern on the universal master mask of FIG. 1, it will be appreciated that there are a number of different patterns presented so that a set of three or four patterns may be used to align any one of a plurality of different style wafers. FIGS. 2 to 6 illustrate different styles of commercially available wafers.

Figure 2:
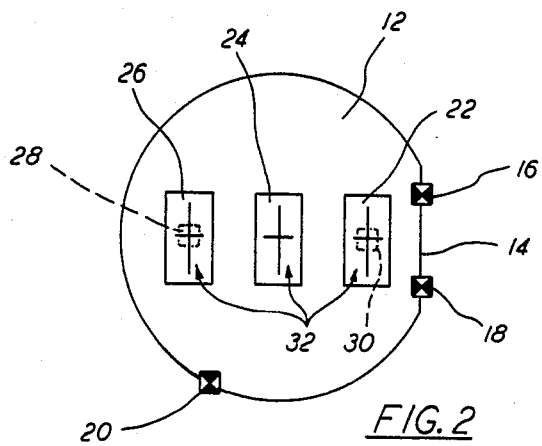
FIGS. 2 to 6 are plan views drawn to reduce scale of several forms of wafers showing alignment patterns, respectively.

According to one embodiment of the present invention, a method of making a wafer-tool for testing the mask-wafer stage motion and the mask-wafer stage alignment in an optical lithographic system comprises the steps of inserting the master mask 10, having an alignment pattern and a motion measurement pattern thereon, into a projection mask aligner and also inserting a photoresist-coated semiconductor wafer 12, FIG. 2, into the same projection mask aligner. The wafer 12 illustrates a five inch semi-standard wafer having a flat portion 14 on its periphery. Then, the wafer and mask are accurately aligned using the alignment patterns 16, 18 and 20. The edge of the wafer intersects the pattern at its center point in each of these patterns.

The next step in the method is exposing the photoresist on the wafer in a conventional manner, as is well known in the operation of optical lithographic systems. This produces an image of the motion measurement pattern in the form of cross hair patterns on the wafer corresponding to the cross hair patterns on the mask, as indicated at 22, 24 and 26. Then, the wafer is chemically etched to perfect the motion measurement pattern thereon, thereby forming the wafer-tool having images of the motion measurement pattern. This wafer-tool is used for coarse stage motion measurement.

The method of making the wafer-tool for fine stage measurement comprises the steps of aligning the mask to a specific location in an aligner, inserting the first wafer tool in the aligner and aligning it to the mask, and setting up the devices in the aligner which will repeatedly position subsequent wafers. The next step in the method is to rotate the mask 90°, while leaving the first wafer-tool in the aligner as a reference. Then the mask is aligned to the first wafer-tool using the center pattern 24. As a result, the mask is aligned. Thereafter, the first wafer-tool is ejected or removed from the aligner and a second unexposed wafer is inserted into the projection mask aligner. Then the wafer is exposed in the conventional manner to produce two fine indicia patterns 28 and 30 indicated by the dotted lines in FIG. 2. Any suitable indicia may be employed as long as it has a very fine scale. This wafer does not contain the patterns 22, 24 and 26. The second wafer is chemically etched to perfect the fine stage motion measurement pattern thereon, thereby forming the second wafer-tool having images of the fine motion measurement pattern.

The two wafer-tools can now be used to test subsequent projection mask aligners.

The coarse stage motion measurement wafer-tool is used to check the transfer motion, the stepping motor motion and the ranges of motion. In the projection mask aligner to be tested, the coarse stage wafer-tool and the universal master mask are inserted. Actually, for this test a mask containing only the alignment patterns 16, 18 and the coarse stage motion measurement patterns 22 and 24 are necessary. The patterns 22, 24 and 26 each contain cross-hairs indicated generally at 32, which contain gratings indicated generally at 34 in FIG. 1, having units of measurement. This tells the operator the vertical motion, horizontal motion and rotational motion. As a result it is possible to quantify the misalignment of the wafer with respect to the mask after movement of the stepping motor and/or after a transfer operation. If necessary, adjustment can be made.

Next, considering the fine stage motion measurement wafer-tool, this tool is used to measure very small submicron motion. For example, when one applies the brakes to a stepping motor it deflects one or two microns after it stops. For accuracy, a high stiffness bellows is used to push against the flexures. The fine stage motion measurement wafer-tool of the present invention is used for checking this fine motion, small range with high resolution. This measurement is usually only necessary during factory assembly and checkout. Usually, it is only necessary to make the coarse motion measurement in the field. When making the fine motion measurement, the fine stage wafer-tool and the universal master mask are inserted into the projection mask aligner to be tested. The mask is rotated 90° counterclockwise and the indicia patterns 28 and 30 are projected onto the wafer 12 from the mask 10 to quantify the fine stage motion measurement.

Figure 3:
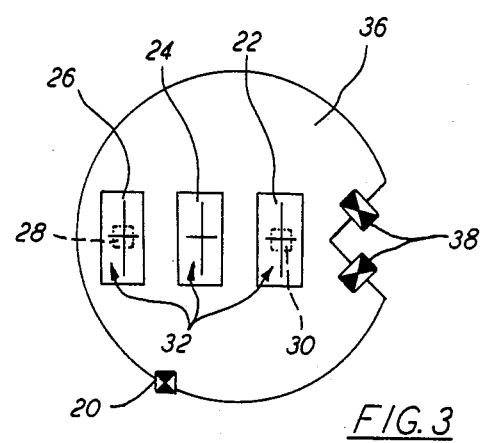

As indicated hereinbefore, the mask 10, FIG. 1, is a universal mask and can be used in the manufacture of a number of different wafer-tools. FIG. 3 illustrates a five inch notched wafer 36, which is conventionally called a five inch IBM notched wafer. For purposes of aligning this wafer, the mask 10 is provided with alignment patterns 38 and 20. The edge of the wafer is aligned to intersect the center points of the alignment patterns 38 and 20. The coarse stage motion measurement patterns 22, 24 and 26 and the fine stage motion measurement patterns 28 and 30 are formed and used in the same manner as described above in connection with the wafer-tool 12.

Figure 4:
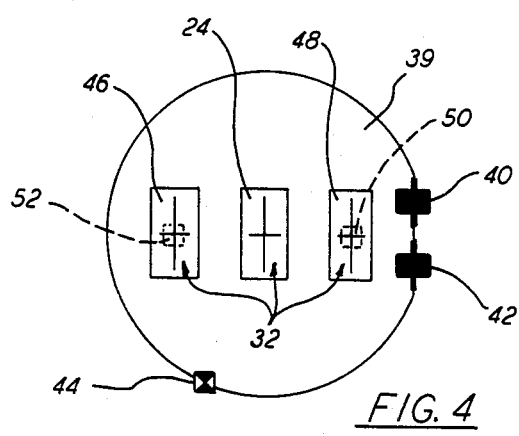

FIG. 4 illustrates a four inch semistandard flat wafer 39. For purposes of aligning this wafer, the mask 10, FIG. 1, is provided with alignment patterns 40, 42 and 44. The edge of the wafer intersects each of the patterns at their centerlines. For alignment purposes the mask 10 is rotated 90° counterclockwise. The mask 10 contains four inch wafer coarse stage motion measurement patterns 46, 24, 48 which contain cross hairs 32 with gratings 34, which are the same as patterns 22 and 26. The mask 10 also contains four inch wafer fine stage motion measurement patterns 50 and 52. In this case the mask is rotated 90° counterclockwise for the wafer alignment and for the coarse stage motion measurement, but is not rotated for the fine stage motion measurement. The coarse motion measurement patterns 46, 24, 48 and the fine stage motion measurement patterns 50 and 52 are formed and used in the same manner as the coarse and fine stage motion measurement patterns described above in connection with the wafer-tools 12 and 36.

Figure 5:
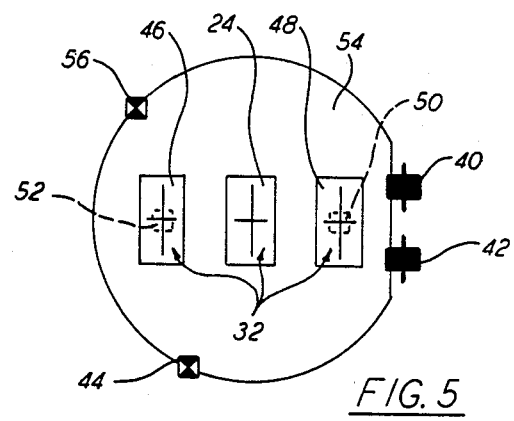

FIG. 5 illustrates a four inch semistandard flat wafer 54, which is adapted for use with The Perkin-Elmer Corporation's projection mask aligner, model M-200. For purposes of aligning this wafer, the mask 10, FIG. 1, is provided with alignment patterns 56, 40, 42 and 44. The edge of the wafer intersects the patterns 56 and 44 at their centers and a line in pattern 40 is made equal to a line in pattern 42. For alignment purposes, the mask 10 is rotated 90° counterclockwise. The coarse stage motion measurement patterns 46, 24, 28 and the fine stage motion measurement pattern 50 and 52 are formed and used in the same manner as described above in connection with the wafer-tool 39.

Figure 6:
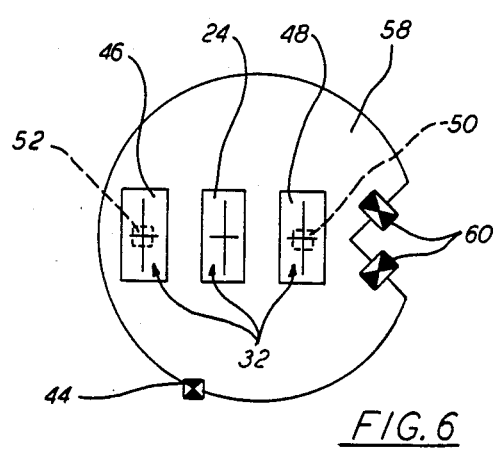

FIG. 6 illustrates a four inch notched wafer 58, which is commonly known as a four inch IBM notched wafer. For purposes of aligning this wafer, the mask 10, FIG.

1, is provided with alignment patterns 60 and 44. The edge of the wafer intersects the patterns 60 and 44 at their center points. For alignment purposes the mask 10 is rotated 90° counter-clockwise. The coarse stage motion measurement patterns 46, 24, 28 and the fine stage motion measurement patterns 50 and 52 are formed and used in the same manner as described above in connection with the wafer-tools 39 and 54.

It will thus be seen that the present invention does indeed provide improved method and apparatus for testing the mask-wafer motion and the mask-wafer stage alignment in optical lithographic systems, which effectively meets the objects specified hereinbefore. Although specific embodiments have been illustrated and described, it will be obvious to those skilled in the art that various modifications may be made without departing from the spirit and scope of the invention which is to be limited solely by the appended claims.

What is claimed is

1. A method of making wafer-tools for use with a master mask for testing wafer coarse stage motion measurement and wafer fine stage motion measurement in an optical lithographic system comprising the steps of:
    inserting said master masks, having an alignment pattern, a wafer coarse stage motion measurement pattern and a wafer fine stage motion measurement pattern thereon, into a projection mask aligner,
    aligning said master mask to a specific location in said aligner,
    inserting a first photoresist-coated semiconductor wafer into said projection mask aligner,
    aligning said master mask and said first wafer with respect to each other using said alignment pattern,
    exposing the photoresist on said first wafer,
    removing said first wafer from said projection mask aligner,
    chemically etching said first wafer to perfect the coarse stage motion measurement pattern thereon, thereby forming a first wafer-tool having an image of the coarse stage motion measurement pattern,
    again aligning said master mask to a specific location in the aligner,
    inserting the first wafer-tool in the aligner,
    aligning the first wafer-tool to said master mask,
    rotating said master mask through a preselected portion of a revolution,
    aligning said master mask to the first wafer-tool using the coarse stage motion measurement pattern,
    removing said first wafer-tool from said projection mask aligner,
    inserting a second photoresist-coated semiconductor wafer into said projection mask aligner,
    exposing the photoresist on said second wafer,
    removing said second wafer from said projection mask aligner, and
    chemically etching said second wafer to perfect the fine stage motion measurement pattern thereon, thereby forming a second wafer-tool having an image of the fine stage motion measurement pattern.

2. A method of making wafer-tools according to claim 1 wherein said preselected portion of a revolution is about 90°.

3. A method of making a wafer-tool for use with a master mask for the fine stage measurement comprising the steps of:
    aligning said master mask to a specific location in a projection mask aligner, said mask having an alignment pattern, a wafer coarse stage motion measurement pattern and a wafer fine stage motion measurement pattern thereon;
    inserting a first wafer-tool into said aligner, said first wafer-tool having a coarse stage motion measurement pattern thereon;
    aligning said first wafer-tool to said master mask;
    rotating said master mask through a preselected portion of a revolution;
    aligning said master mask to the first wafer-tool using the coarse stage motion measurement pattern;
    removing said first wafer-tool from said projection mask aligner;
    inserting a photoresist coated semiconductor wafer into said projection mask aligner;
    exposing the photoresist on said wafer;
    removing said wafer from said projecting mask aligner; and
    chemically etching said wafer to perfect the fine stage motion measurement pattern thereon, thereby forming a second wafer-tool having an image of the fine stage motion measurement pattern.

4. A method of making wafer-tools according to claim 3 wherein said preselected portion of a revolution is about 90°.

* * * * *